(12) United States Patent
Ide

(10) Patent No.: US 9,136,669 B2
(45) Date of Patent: Sep. 15, 2015

(54) LASER LIGHT SOURCE

(75) Inventor: Masafumi Ide, Tokorozawa (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 83 days.

(21) Appl. No.: 13/588,546

(22) Filed: Aug. 17, 2012

(65) Prior Publication Data

US 2013/0044489 A1    Feb. 21, 2013

(30) Foreign Application Priority Data

Aug. 19, 2011   (JP) .................................. 2011-179839

(51) Int. Cl.
| | | |
|---|---|---|
| *H01S 5/00* | (2006.01) | |
| *H01S 5/022* | (2006.01) | |
| *G02F 1/35* | (2006.01) | |
| *G02F 1/377* | (2006.01) | |
| *H01S 5/22* | (2006.01) | |

(52) U.S. Cl.
CPC .......... *H01S 5/02252* (2013.01); *G02F 1/3544* (2013.01); *G02F 1/377* (2013.01); *H01S 5/02256* (2013.01); *H01S 5/0092* (2013.01); *H01S 5/02284* (2013.01); *H01S 5/22* (2013.01)

(58) Field of Classification Search
CPC ..... G02F 1/37; G02F 1/377; H01S 3/094019; H01S 5/0228; H01S 5/02284; H01S 5/1028; H01S 5/22; H01S 5/2235; H01S 5/02256; H01S 3/025; H01S 3/0092; H01S 3/063; H01S 3/0637; H01S 3/1053; H01S 3/109; H01S 3/1095; H01S 5/0092; H01S 5/021; H01S 5/02252; G02B 27/20; G02B 27/48; G02B 27/0927; G02B 27/0028; F21Y 2101/025

USPC ........... 362/259, 553; 372/46.012, 43, 64, 92, 372/97, 108

See application file for complete search history.

(56) References Cited

U.S. PATENT DOCUMENTS

| | | | | |
|---|---|---|---|---|
| 5,835,650 | A * | 11/1998 | Kitaoka et al. .................. | 385/49 |
| 6,136,626 | A * | 10/2000 | Kidoguchi et al. ............. | 438/38 |
| 7,350,988 | B2 * | 4/2008 | Nagasaka et al. ............... | 385/94 |

(Continued)

FOREIGN PATENT DOCUMENTS

| | | | |
|---|---|---|---|
| JP | 2001-337253 A | 12/2001 | |
| JP | 2007-133011 A | 5/2007 | |

(Continued)

OTHER PUBLICATIONS

Japan Patent Office, Office Action for Japanese Patent Application No. 2011-179839, Jun. 30, 2015.

*Primary Examiner* — Peggy Neils
*Assistant Examiner* — Zheng Song

(57) ABSTRACT

An object of the present invention is to provide a laser light source that includes a laser element and an optical element that are optically coupled efficiently and directly. A laser light source includes, a laser element which has a ridge part and emits laser light from a light emission part, an optical element which has a waveguide for guiding the laser light that is incident on an incidence part; and a substrate for joining the laser element and the optical element close so as to be optically coupled directly, and, in this laser light source, the laser element and the optical element are joined to the substrate in a state in which a position of the incidence part is shifted a predetermined distance upward or downward with respect to a position of the light emission part.

5 Claims, 8 Drawing Sheets

(56) References Cited

U.S. PATENT DOCUMENTS

| | | |
|---|---|---|
| 2001/0024552 A1* | 9/2001 | Kitaoka et al. .................. 385/91 |
| 2001/0048705 A1* | 12/2001 | Kitaoka et al. .................. 372/43 |
| 2004/0105480 A1* | 6/2004 | Sidorin et al. .................. 372/97 |
| 2007/0230533 A1* | 10/2007 | Park et al. ........................ 372/96 |
| 2010/0309946 A1* | 12/2010 | Nakamura et al. .............. 372/75 |

FOREIGN PATENT DOCUMENTS

| | | |
|---|---|---|
| JP | 2010-262252 A | 11/2010 |
| WO | 03/104868 A1 | 12/2003 |
| WO | 2011/065384 A1 | 6/2011 |

* cited by examiner

LASER LIGHT SOURCE

This application is a new U.S. patent application that claims benefit of JP 2011-179839, filed on Aug. 19, 2011, the entire content of JP 2011-179839 is hereby incorporated by reference.

TECHNICAL FILED

The present invention relates to a laser light source, and, more particularly, relates to a laser light source in which a laser element and an optical element are optically coupled directly.

BACKGROUND

A laser light source to have a semiconductor laser, in which a lens is provided in the light emission part, and an SHG (second harmonic generation) element of an optical waveguide-type, which performs wavelength conversion of light that is emitted from the semiconductor laser, is known (see, for example, JP-2010-262252-A).

With the above laser light source, the semiconductor laser and the SHG element are subject to position matching adjustment, so that the incidence part of the optical waveguide of the SHG element matches the focus position of the lens provided in the semiconductor laser.
JP-2010-262252-A (FIG. 1)

SUMMARY

However, providing an optical coupling means, such as an optical part like a lens and so on, between the semiconductor laser and the optical element, might cause an increase in cost, loss in the amount of light and so on, due to the provision of the optical coupling means. Also, the light emission part of the laser element in the semiconductor laser and the optical coupling means and so on require position matching, and this raises a problem that the semiconductor laser becomes bigger, and, as a result, it becomes difficult to make the laser light source smaller. On the other hand, given an increase in cost and loss in the amount of light due to provision of an optical coupling means, with a laser light source, it is more efficient to optically couple a laser element and an optical element directly, without using an optical coupling means.

Note that laser light to be emitted from the light emission part of a laser element is not necessarily emitted straight, in a vertical direction, from the light emission part of the laser element. Furthermore, in an optical element to receive the laser light from the laser element in an incidence part, the laser light that is incident straight, on the incident part, from a vertical direction, does not necessarily lead to good output.

So, it is an object of the present invention to provide a laser light source for solving the above problems.

Furthermore, it is also an object of the present invention to provide a laser light source to include a laser element and an optical element that are optically coupled efficiently and directly.

A laser light source includes a laser element which has a ridge part and emits laser light from a light emission part, an optical element which has a waveguide for guiding the laser light that is incident on an incidence part, and a substrate for joining the laser element and the optical element so that the laser element and the optical element are close to each other and are optically coupled directly, and, in this laser light source, the laser element and the optical element are joined to the substrate in a state in which a position of the incidence part is shifted a predetermined distance upward or downward with respect to a position of the light emission part.

Furthermore, with the laser light source, preferably, when a ridge part side of the laser element is joined to the substrate, the optical element is joined to the substrate such that the position of the incidence part is shifted a predetermined distance downward with respect to the position of the light emission part.

Furthermore, with the laser light source, preferably, when a waveguide side of the optical element is joined to the substrate, the optical element is joined to the substrate such that the light emission part is shifted a predetermined distance downward with respect to the position of the incidence part.

Furthermore, with the laser light source, preferably, the incidence part of the optical element is placed in a position that is a distance to match an intermediate field of the laser light apart from the light emission part of the laser element.

Furthermore, with the laser light source, preferably, the optical element is a wavelength conversion element to convert a wavelength of the laser light emitted from the laser element.

With the laser light source, the ridge-type laser element and the optical waveguide-type SHG element are optically coupled directly, based on their respective optical characteristics, so that it is possible to improve the efficiency of coupling of the ridge-type laser element and the optical waveguide-type SHG element.

Also, given that, with the laser light source, the ridge-type laser element and the optical waveguide-type SHG element are optically coupled directly, without using an optical coupling means, so that it is possible to achieve a decrease in the cost, miniaturization, flattening and/or high output of the laser light source.

BRIEF DESCRIPTION OF THE DRAWINGS

These and other features and advantages of the present invention will be better understood by reading the following detailed description, taken together with the drawings wherein.

DESCRIPTION CF EMBODIMENTS

Now, a laser light source according to the present invention will be described with reference to the accompanying drawings. However, note that the technical scope of the present invention is by no means limited to the following embodiments and covers the invention recited in the claims and its equivalents.

Figure 1A:
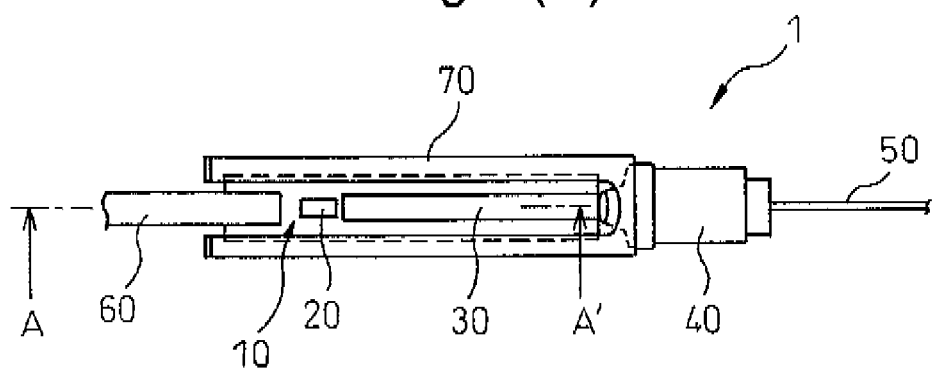
FIG. 1(a) to FIG. 1(c) are diagrams illustrating a laser light source 1.
Figure 1B:
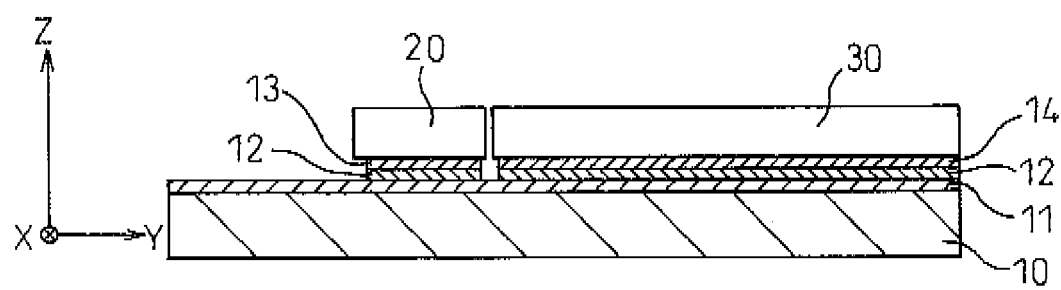
Figure 1C:

FIG. 1(a) is a plan view of a laser light source 1, FIG. 1(b) is an AA' cross-sectional view of FIG. 1(a), and FIG. 1(c) is a cross-sectional view of a micro bump.

The laser light source 1 is formed to include a silicon substrate 10, an LD (laser diode) element 20 that is fixed on the silicon substrate 10, and an SHG element 30 that is provided to perform wavelength conversion of light emitted from the LD element 20, a coupling element 40 that is provided to propagate laser light after wavelength conversion, emitted from the SHG element 30, to an optical fiber 50, an FPC (flexible printed substrate) 60 that is provided to supply a drive current to the LD element 20, and a holding member 70 that holds the silicon substrate 10, and so on. Note that it is equally possible to provide a cover member (not illustrated) to cover the laser light source 1, including the holding member 70.

A $SiO_2$ (silicon dioxide) thin film 11 is formed on the silicon substrate 10, a Ti(titanium) thin film 12 is formed on the $SiO_2$ thin film 11, and micro bumps 13 and 14 are formed on the Ti thin film 12. The $SiO_2$ thin film 11 functions as an insulating layer to insulate between the silicon substrate 10 and the micro bumps 13 and 14, and the Ti thin film 12 is formed to improve the adhesion between the $SiO_2$ thin film 11, and the micro bumps 13 and 14 that are formed by Au.

As illustrated in FIG. 1(c), in the micro bump 13, a plurality of projecting parts of a truncated cone shape are arranged left and right evenly, at equal pitches (for example, at 2 μm pitches). The projecting part of the truncated cone shape can be made a round shape with a bottom surface of a 2 μm diameter, a round shape with a top surface of a 1 μm diameter, and 2 μm high. The same applies to the micro bump 14.

The surface of the micro bump 13 is subject to activation processing, and an Au layer is formed on the substrate of the micro bump side of the LD element 20, and that surface is subject to activation processing. Consequently, by simply applying a predetermined load and mounting an LD element 20 above the micro bump 13, the LD element 20 is fixed on the micro bump 18 by surface activation coupling. Also, the LD element 20 is designed to receive a supply of a drive current via the FPC 60 and the micro bump 13.

The surface of the micro bump 14 is also subject to activation processing, and an Au layer is formed on the substrate of the micro bump side of the SHG element 30, and that surface is subject to activation processing. Consequently, by simply applying a predetermined load and mounting an SHG element 30 above the micro bump 14, the SHG element 30 is fixed on the micro bump 14 by surface activation coupling. Also, by applying a predetermined load upon the SHG element 30, the micro bump 14 is crushed, so that it is possible to adjust the relative position relationship between the SHG element 30 and the LD element 20 in the height direction (Z-axis direction). Note that it is not necessary to supply a drive current to operate the SHG element 30, so that it is not necessary to connect the SHG element 30 and the FPC 60 electrically.

Note that the shape of the micro bump illustrated in FIG. 1(c) is an example, and is by no means limited to this. Also, in the event a scheme is adopted whereby the relative position relationship between the SHG element 30 and the LD element 20 in the height direction (Z-axis direction) can be adjusted, it is also possible to employ other schemes for joining, apart from the micro bumps (for example, normal Au bump and so on).

Figure 2:
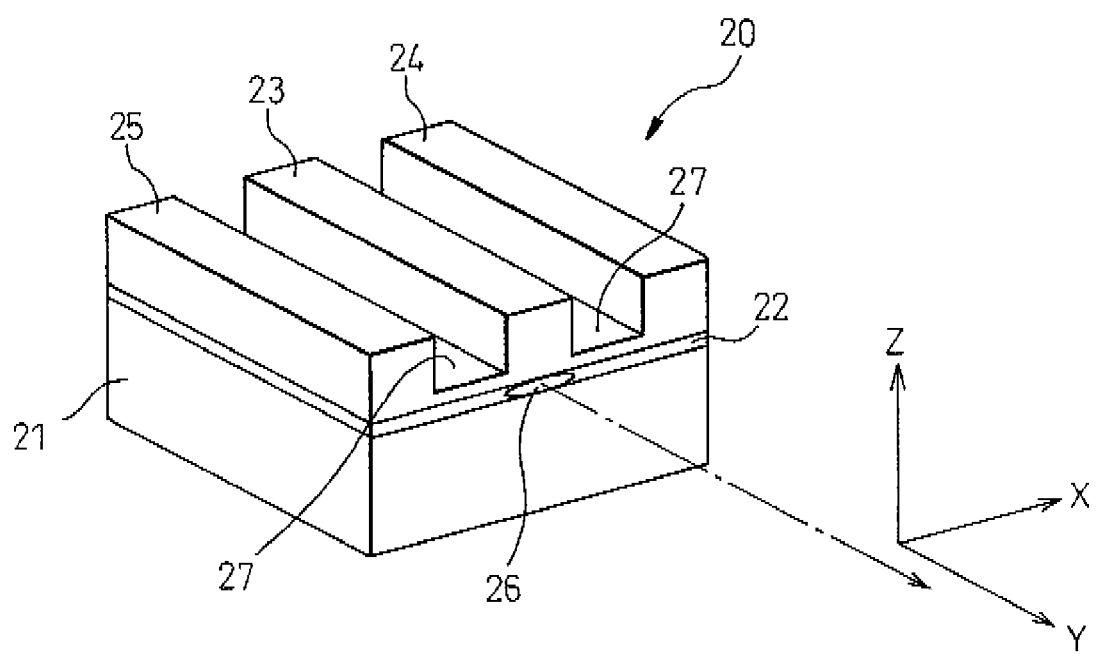
FIG. 2 is a schematic configuration diagram of an LD element 20.

FIG. 2 is a schematic configuration diagram of the LD element 20.

The LD element 20, by a ridge-type laser element (not embedded type), emits laser light having a wavelength of 1064 nm, from a light emission part 26 of an active layer (GaAs) 22 between a cladding layer (n-type AlGaAs) 21 and a ridge part (p-type AlGaAs) 23. To optically couple the laser element and the optical element in the laser light source well, the LD element 20 does not employ an embedding structure and has the ridge part 23 that serves as a waveguide to guide light. However, in the event the ridge part 23 side is joined to the silicon substrate 10 by junction down, its surface is no longer flat, and therefore contact parts 24 and 25 are formed to sandwich a groove part 27. According to this configuration, the ridge part 23 side becomes flat, and therefore can be joined to the silicon substrate 10 reliably by junction down.

Figure 3:
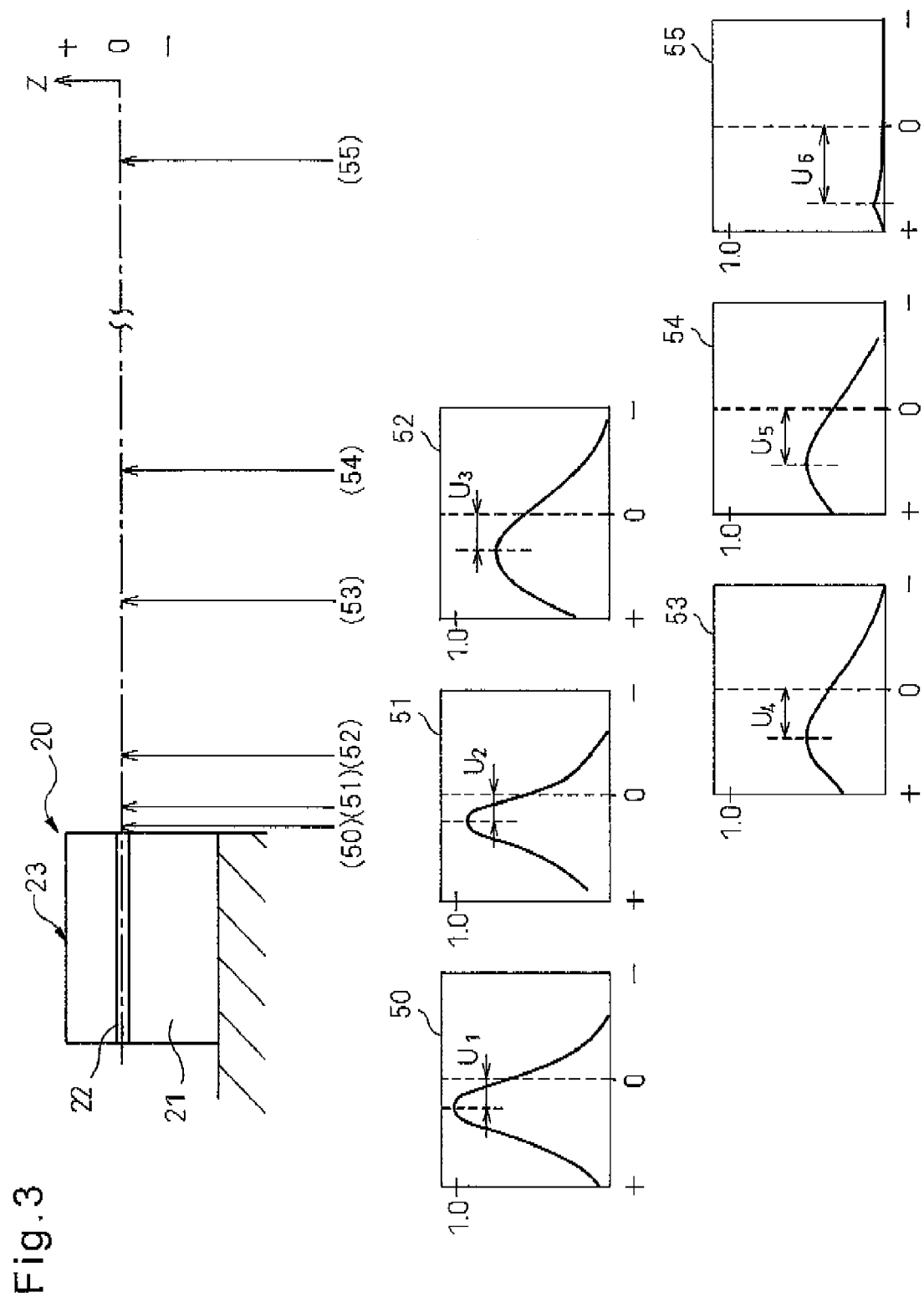
FIG. 3 is a diagram illustrating a distribution of light intensity (1) of laser light that is output from the LD element 20.

FIG. 3 is a diagram illustrating a distribution of light intensity (1) of laser light that is output from the LD element 20.

As illustrated in FIG. 3, the LD element 20 is placed on the base such that the ridge part 23 is placed above and the cladding layer 21 is joined, the laser light on the Z axis at the same level as the light emission part 26 is measured. Also, above the ridge part 23 is an open state, where obstacles such as the base are not placed.

The light intensity distribution 50 shows the distribution of light intensity in a position that is 0.1 μm apart from the light emission part 26 (near field), and the light intensity distribution 51 shows the distribution of light intensity in a position that is 1 μm apart from the light emission part 26. Also, the light intensity distribution 52 shows the distribution of light intensity in a position that is 3 μm apart from the light emission part 26 (intermediate field), and the light intensity distribution 53 shows the distribution of light intensity in a position that is 10 μm apart from the light emission part 26 (intermediate field). Furthermore, the light intensity distribution 54 shows the distribution of light intensity in a position that is 15 μm apart from the light emission part 26 (intermediate field), and the light intensity distribution 55 shows the distribution of light intensity in a position that is 110 μm (approximately 100×λ (1064 nm)) apart from the light emission part 26 (far-field).

Note that the "near field" refers to the neighborhood of the light emission part of the LD element 20, the "intermediate field" refers to positions 3λ to 15λ apart from the light emission part of the LD element 20 (where λ is the light emission wavelength of the LD element 20), and the "far field" refers to positions 100λ or more apart from the light emission part of the LD element 20.

The origin "0" in the light intensity distribution 50 to the light intensity distribution 55 designates the same position as the light emission part 26 of the LD element 20, "+" designates the upper side in the drawing and "−" designates the lower side in the drawing. Also, the intensity of light in the light intensity distribution 50 to the light intensity distribution 55 is given such that the maximum light intensity in a position that is 0.1 μm apart from the light emission part 26 (near field) is shown as "1.0." Furthermore, U1 to U6 show the amount of deviation between the position of the maximum intensity and the origin, in each distribution of light intensity. Note that the amount of deviation (U6) in the far-field (see the light intensity distribution 55) is the maximum.

As clear from the light intensity distribution 50 to the light intensity distribution 55, from the near field to the intermediate field, the position of the maximum intensity in each distribution of light intensity is deviated toward the ridge part 23 side, from the same position (origin) as the light emission part 26. A possible reason of this is that, given that the ridge part 23 of the LD element 20 functions as a waveguide, the light intensity distribution of laser light emitted from the light emission part 26 of the LD element 20 is not a distribution that peaks at the same position as the light emission part 26 of the LD element 20, and is deviated toward the ridge part 23 side. Also, as clear from the light intensity distribution 55, in the far-field, the amount of deviation toward the ridge part 23 side is the maximum.

Figure 4:
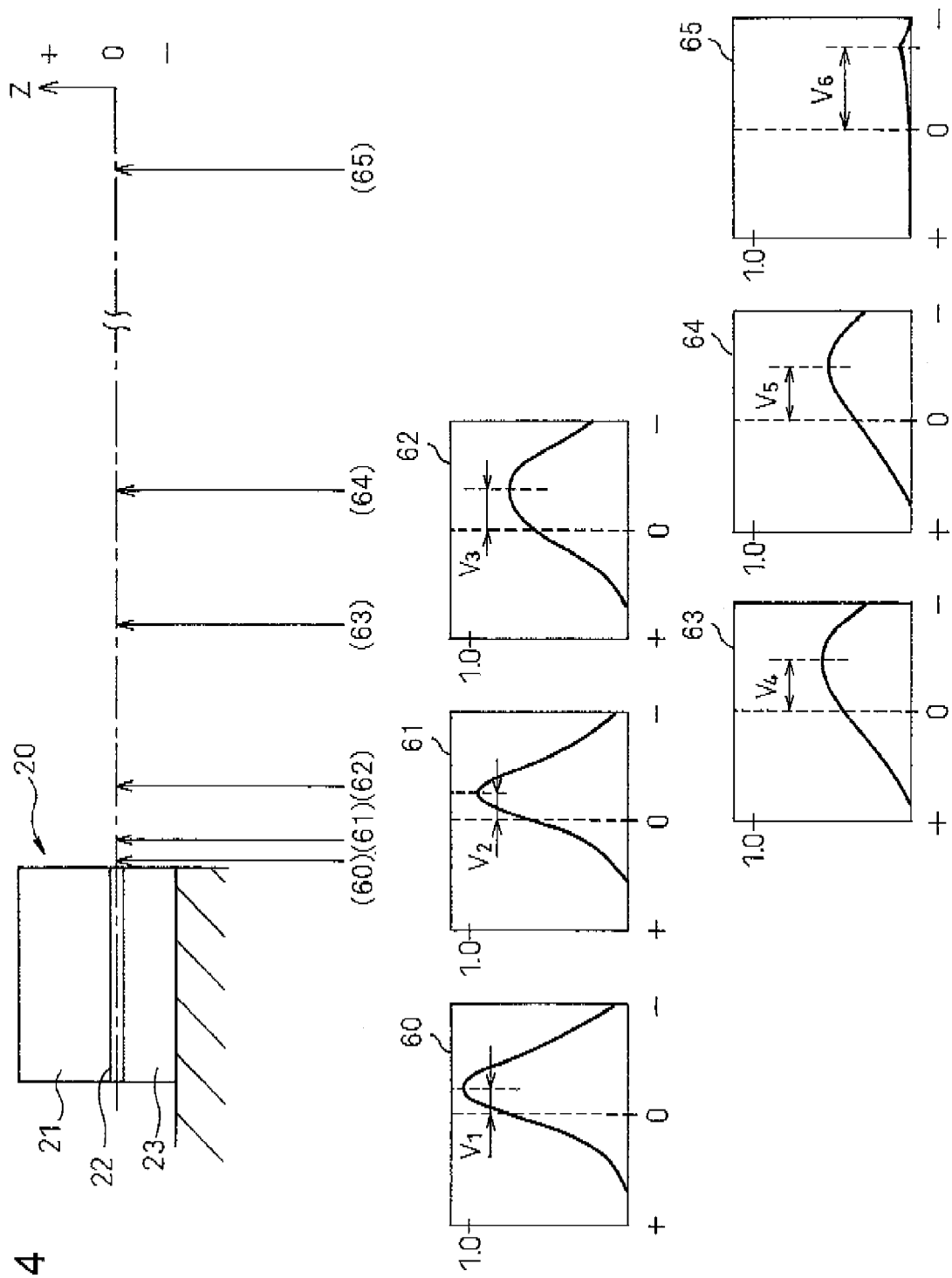
FIG. 4 is a diagram illustrating a distribution of light intensity (2) of laser light that is output from the LD element 20.

FIG. 4 is a diagram illustrating a distribution of light intensity (2) of laser light that is output from the LD element 20.

As illustrated in FIG. 4, the LD element 20 is placed on the base such that the cladding layer 21 is placed above and the ridge part 23 is joined, the laser light on the Z axis at the same level as the light emission part 26 is measured. Also, above the cladding layer 21 is an open state, where obstacles such as the base are not placed.

The light intensity distribution 60 shows the distribution of light intensity in a position that is 0.1 μm apart from the light emission part 26 (near-field), and the light intensity distribution 61 shows the distribution of light intensity in a position that is 1 μm apart from the light emission part 26. Also, the light intensity distribution 62 shows the distribution of light intensity in a position that is 3 μm apart from the light emission part 26 (intermediate field), and the light intensity distribution 63 shows the distribution of light intensity in a position that is 10 μm apart from the light emission part 26 (intermediate field). Furthermore, the light intensity distribution 64 shows the distribution of light intensity in a position that is 15 μm apart from the light emission part 26 (intermediate field), and
the light intensity distribution 65 shows the distribution of light intensity in a position that is 110 μm (approximately 100×λ (1064 nm)) apart from the light emission part 26 (far-field).

The origin "0" in the light intensity distribution 60 to the light intensity distribution 65 designates the same position as the light emission part 26 of the LD element 20, "+" designates the upper side in the drawing and "−" designates the lower side in the drawing. Also, the intensity of light in the light intensity distribution 60 to the light intensity distribution 65 is given such that the maximum light intensity in a position that is 0.1 μm apart from the light emission part 26 (near field) is shown as "1.0." Furthermore, V1 to V6 show the amount of deviation between the position of the maximum intensity and the origin, in each distribution of light intensity. Note that the amount of deviation (V6) in the far-field (see the light intensity distribution 65) is the maximum.

As clear from the light intensity distribution 60 to the light intensity distribution 65, from the near field to the intermediate field, the position of the maximum intensity in each distribution of light intensity is deviated toward the ridge part 23 side, from the same position (origin) as the light emission part 26. A possible reason of this is that, given that the ridge part 23 of the LD element 20 functions as a waveguide, the light intensity distribution of laser light emitted from the light emission part 26 of the LD element 20 is not a distribution that peaks at the same position as the light emission part 26 of the LD element 20, and is deviated toward the ridge part 23 side. Also, as clear from the light intensity distribution 65, in the far-field, the amount of deviation toward the ridge part 23 side is the maximum.

Furthermore, the amounts of deviation V1 to V5 from the near field to the intermediate field are smaller values than the amounts of deviation U1 to U5 from the near field to the intermediate field illustrated in FIG. 3. A possible reason of this is that, since the base exists on the ridge part 23 side, the amount of deviation of the distribution of intensity of laser light that is emitted from the light emission part 26 of the LD element 20 is lower.

From FIG. 3 and FIG. 4, it is clear that, although the amount of deviation varies, the light intensity distribution of laser light emitted from the light emission part 26 of the LD element 20 is not a distribution that peaks in the same position as the light emission part 26 of the LD element 20 and deviates toward the ridge part 23 side. Note that this phenomenon is a characteristic that is common to LD elements (ridge-type laser elements) having a ridge-type waveguide.

Figure 5:
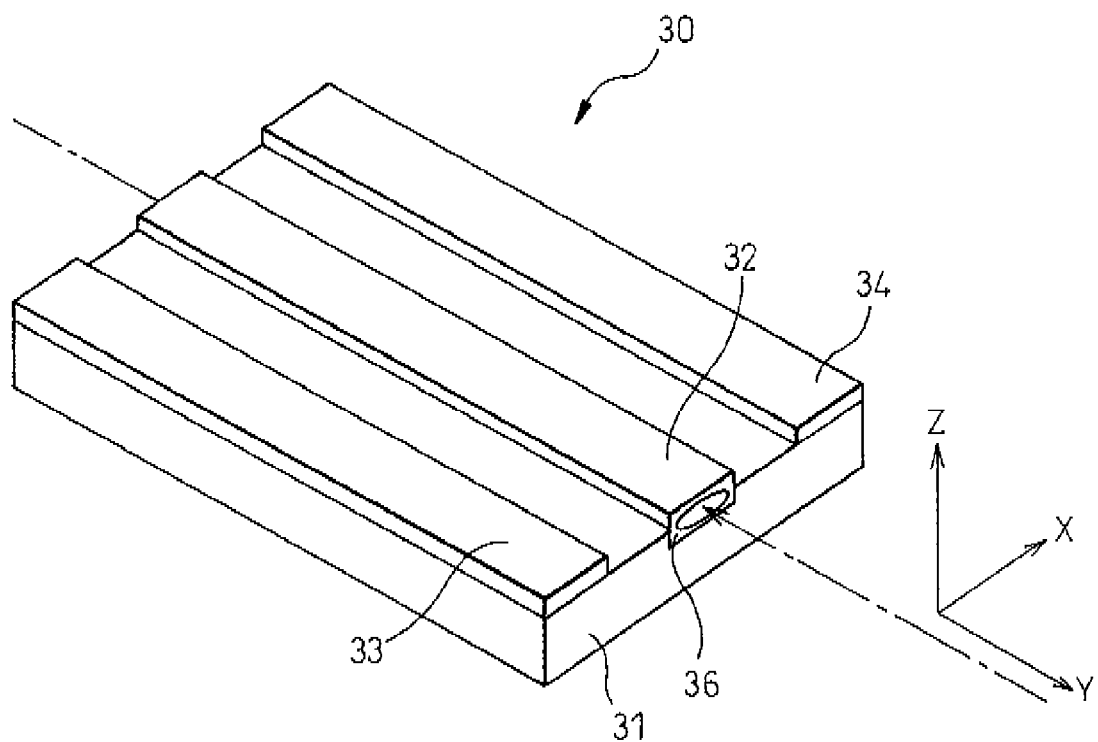
FIG. 5 is a schematic configuration diagram of an SHG element 30.

FIG. 5 is a schematic configuration diagram of the SHG element 30.

The SHG element 30 is given by forming an optical waveguide 32 on the surface of a PPLN (Periodically Poled Lithium Niobate) crystal 31, optically polishing both end surfaces of the optical waveguide 32, and applying antireflection coating for laser light of a fundamental wavelength of 1064 nm. When laser light having a fundamental wavelength of 1064 nm is incident on the incidence part 36 provided in the end surface of the optical waveguide 32, second harmonic is produced, and laser light having a ½ wavelength of the original laser light—that is to say, G light having a wavelength of 532 nm—is emitted. However, in the event the optical waveguide 32 side of the SHG element 30 is joined to the silicon substrate 10, the surface is not flat, so that the contact parts 33 and 34 are formed to sandwich the optical waveguide 32. According to this configuration, the optical waveguide 32 side becomes flat and therefore can be joined to the silicon substrate 10, reliably.

Figure 6A:
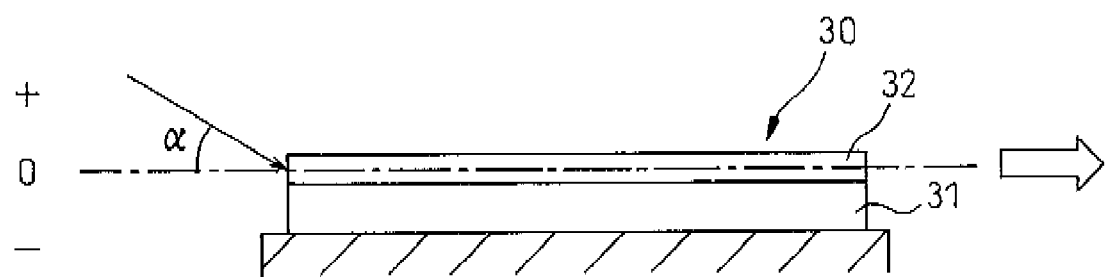
FIG. 6(a) and FIG. 6(b) are diagrams illustrating relationship (1) between the angle of incident light and the intensity of emitted light, in the SHG 30.
Figure 6B:
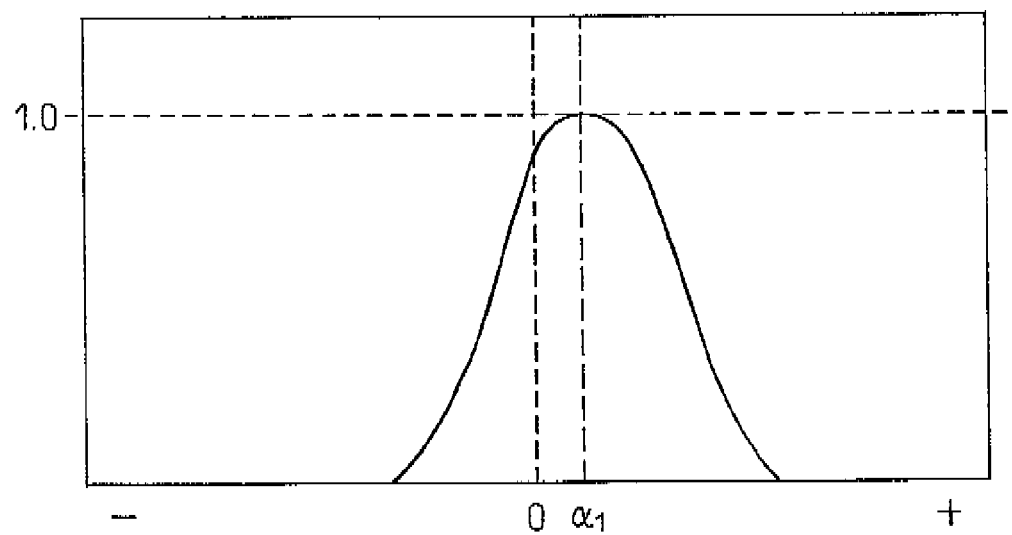

FIG. 6 is a diagram illustrating the relationship (1) between the angle of incident light and the intensity of emitted light in the SHG 30.

As illustrated in FIG. 6(*a*), the SHG element 30 is placed on the base such that the optical waveguide 32 is placed above and the PPLN crystal 32 is joined. Next, the maximum light intensity of G light having a wavelength of 532 nm, which is emitted when laser light having a fundamental wavelength of 1063 nm is incident on the incidence part 36, is measured while changing the angle of incidence. Also, above the optical waveguide 32 is an open state, where obstacles such as the base are not placed.

In FIG. 6(*b*), the horizontal axis is the angle of incidence α, and the vertical axis is the light intensity of G light having a wavelength of 532 nm, emitted from the SHG element 30. Note that, in FIG. 6(*b*), the value of the vertical axis is normalized assuming that the maximum value of light intensity is "1.0." Also, a position that is parallel to the center part of the incidence part 36 of the SHG element 30 is made the origin "0," while the upper side in the drawing of FIG. 6(*a*) is "+" and the lower side in the drawing of FIG. 6(*b*) is "−."

As clear from FIG. 6(*b*), when laser light having a fundamental wavelength of 1063 nm is incident from the "+" side in FIG. 6(*a*) at an angle of incidence α1, G light of a wavelength of 532 nm is emitted in the most optimal fashion. A possible reason of this is that, given that the optical waveguide 32 projects from the PPLN crystal 31, when light to travel from the optical waveguide 32 side toward the PPLN crystal 31 side is incident, second harmonic is produced with the best efficiency.

FIG. 7 is a diagram illustrating the relationship (2) between the angle of incident light and the intensity of emitted light, in the SHG 300.

As illustrated in FIG. 7(*a*), the SHG element 30 is placed on the base such that the PPLN crystal 31 is placed above and the optical waveguide 32 is joined. Next, the maximum light intensity of G light having a wavelength of 532 nm, which is emitted when laser light having a fundamental wavelength of 1063 nm is incident on the incidence part 36, is measured while changing the angle of incidence. Also, above the PPLN crystal 31 is an open state, where obstacles such as the base are not placed.

Figure 7A:
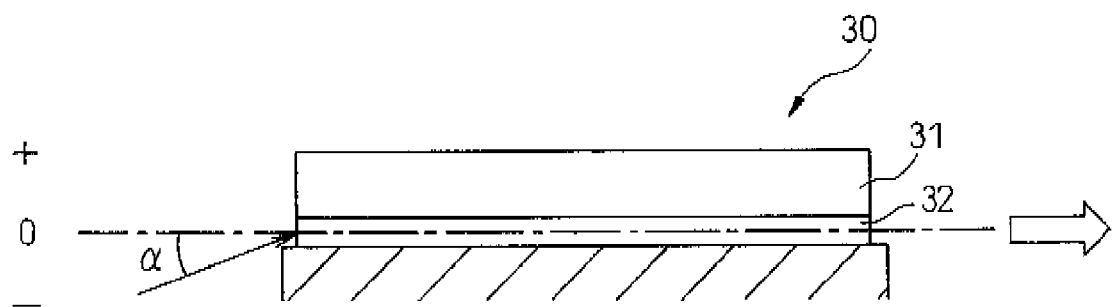
FIG. 7(a) and FIG. 7(b) are diagrams illustrating relationship (2) between the angle of incident light and the intensity of emitted light, in the SHG 30.
Figure 7B:
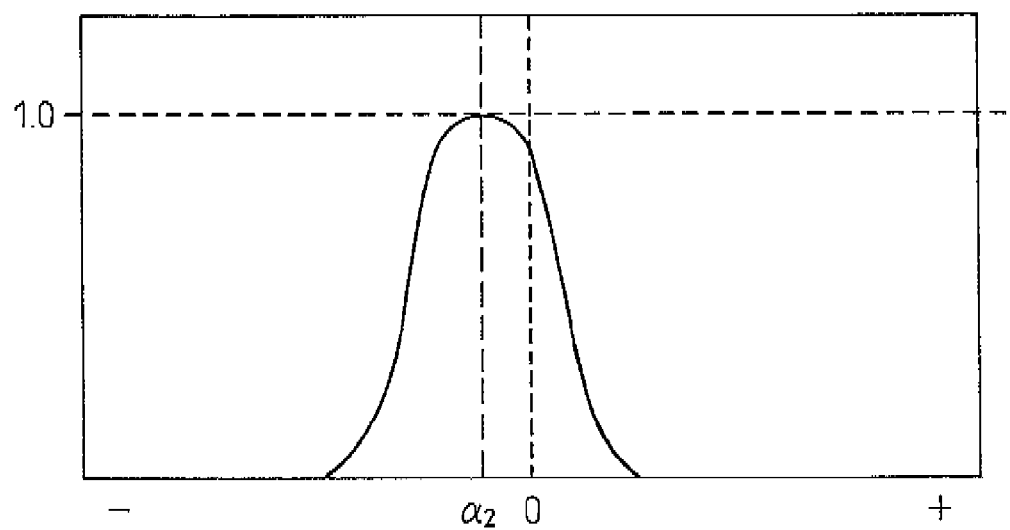

In FIG. 7(b), the horizontal axis is the angle of incidence α, and the vertical axis is the light intensity of G light having a wavelength of 532 nm, emitted from the SHG element 30. Note that, in FIG. 7(b), the value of the vertical axis is normalized assuming that the maximum value of light intensity is "1.0." Also, a position that is parallel to the center part of the incidence part 36 of the SHG element 30 is made the origin "0," while the upper side in the drawing of FIG. 7(a) is "+" and the lower side in the drawing of FIG. 7(b) is "−."

As clear from FIG. 7(b), when laser light having a fundamental wavelength of 1063 nm is incident from the "−" side in FIG. 7(a) at an angle of incidence α2, G light of a wavelength of 532 nm is emitted in the most optimal fashion. A possible reason of this is that, given that the optical waveguide 32 projects from the PPLN crystal 31, when light to travel from the optical waveguide 32 side toward the PPLN crystal 31 side is incident, second harmonic is produced with the best efficiency. Also, α1 illustrated in FIG. 6(b), which has been described earlier, and α2 illustrated in FIG. 7(b), have the same absolute value.

From FIG. 6 and FIG. 7, when a fundamental wavelength is received as input in the SHG element 30 having an optical waveguide, light to travel from the optical waveguide 32 side toward the PPLN crystal 31 side is incident, so that second harmonic may be produced with the best efficiency. Note that the above characteristic of the SHG element 30 may be a characteristic that applies to all SHG elements (optical waveguide-type SHG elements) in which an optical waveguide is projected.

FIG. 8 is a diagram illustrating a state of optical coupling between the LD element 20 and the SHG element 30.

From FIG. 3 and FIG. 4, it is clear that, with the LD element 20 having a ridge-type waveguide, in the intermediate field, the distribution of light intensity of laser light that is emitted, is deviated toward the ridge part 23 side. From FIG. 6 and FIG. 7, when a fundamental wavelength is received as input in the SHG element 30 having an optical waveguide, light to travel from the optical waveguide 32 side toward the PPLN crystal 31 side is incident, so that second harmonic may be produced with the best efficiency.

In the event the LD element 20 and the SHG element 30 are optically coupled directly without using an optical coupling means (collimator lens, light condensing lens, and so on), it is preferable to place the light emission part 26 of the LD element 20 and the incidence part 36 of the SHG element 30 as close as possible. However, in the event of implementation on a silicon substrate 10 by means of an implementing device, the maximum possible distance d to be the closest is approximately 10 μm—that is, an intermediate field distance.

Figure 8A:
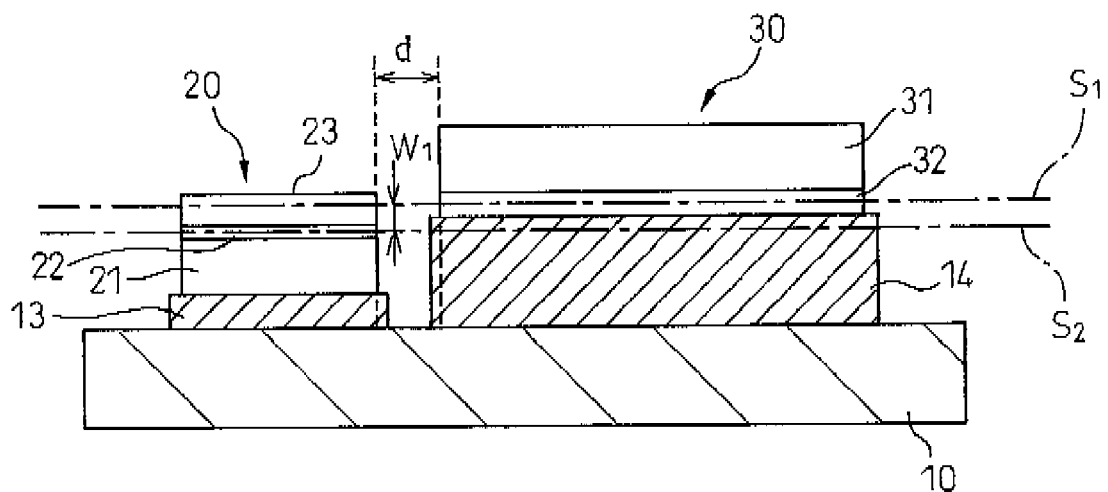
FIG. 8(a) and FIG. 8(b) are diagrams illustrating a state of optical coupling between the LD element 20 and the SHG element 30.

In FIG. 8(a), the cladding layer 21 of the LD element 20 is implemented to be joined to the silicon substrate 10 by means of the micro bump 13, and the optical waveguide 32 side of the SHG element 30 is implemented to be joined to the silicon substrate 10 by means of the micro bump 14. Note that, in FIG. 8(a), the position accuracy in the plane direction (XY plane) on the silicon substrate 10 is adjusted by means of an implementing device, upon implementation by providing a reference mark such as an alignment mark on the silicon substrate 10. Also, the distance d to the LD element 20 is set to be 10 μm.

In this way, in the event of FIG. 8(a), the LD element 20 having a ridge-type waveguide has its ridge part placed above, and is jointed to the silicon substrate 10. Also, the optical waveguide 32 side of the SHG element 30 is joined to the silicon substrate so that the position S1 of the incidence part 36 of the optical waveguide 32 of the SHG element 30 having an optical waveguide comes above the position 52 of the light emission part 26 of the LD element 20. Consequently, in the event of FIG. 8(a), it is possible to optically couple the LD element 20 and the SHG element 30 well. That is to say, in the event the optical waveguide 32 side of the SHG element 30 is joined to the silicon substrate 10, the LD element 20 is joined to the silicon substrate 10 such that the position of the light emission part 26 is shifted a distance W1 downward with respect to the position of the incidence part 36. The position relationship of the LD element 20 with respect to the SHG element 30 is determined by adjusting the amount of crush of the micro bump 13 and/or 14.

Figure 8B:
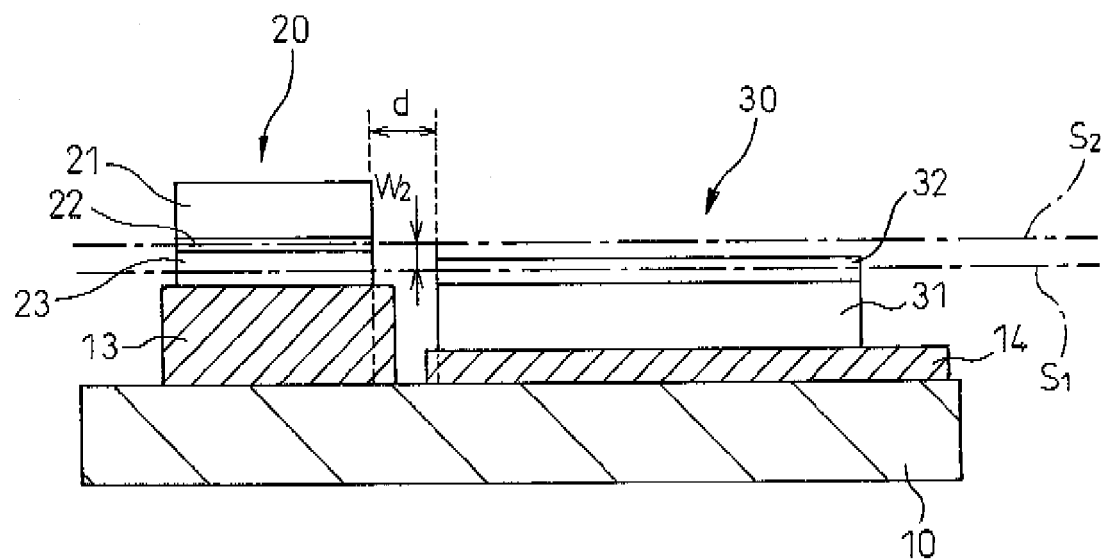

In FIG. 8(b), the LD element 20 having a ridge-type waveguide has its ridge part 23 side joined to the silicon substrate 10 by junction down. Also, the SHG element 30 is joined to the silicon substrate such that, with respect to the position S2 of the light emission part 26 of the LD element 20, the position 81 of the incidence part 36 of the optical waveguide 32 of the SHG element 30 having an optical waveguide is lower, and the optical waveguide 32 of the SHG element 30 is higher. Consequently, in the event of FIG. 8(b), it is possible to optically couple the LD element 20 and the SHG element 30, directly, and well. That is to say, in the event the optical waveguide 32 side of the SHG element 30 is joined to the silicon substrate 10, the LD element 20 is joined to the silicon substrate 10 such that the position of the incidence part 36 is shifted a distance W2 downward with respect to the position of the light emission part 26. The position relationship of the LD element 20 with respect to the SHG element 30 is determined by adjusting the amount of crush of the micro bump 13 and/or 14.

As has been described with the examples of FIG. 3 and FIG. 4, in the event the ridge part 23 side of the LD element 20 having a ridge-type waveguide is joined to the silicon substrate 10 by junction down, the amount of deviation of the center position in the distribution of light intensity from the origin is less. Consequently, by making the amount of deviation W1 between the position S2 and the position S1 in FIG. 8(a) greater than the amount of deviation W2 between the position S2 and the position S1 in FIG. 8(b), it is possible to perform better direct optical coupling.

What is claimed is:

1. A laser light source producing method, comprising the steps of:
    jointing a laser element which has a ridge part and emits laser light from a light emission part to a first micro bump provided on a substrate; and
    jointing an optical element having a waveguide for guiding the laser light which is incident on an incidence part to a second micro bump provided on the substrate such that the laser element and the optical element are close to each other and are optically coupled directly,
    wherein the position relationship between the laser element and the optical element is determined such that the incidence part is shifted a predetermined distance upward or downward with respect to a position of the light emission part by adjusting the amount of crush of the first or second micro bump.

2. The laser light source producing method according to claim 1, wherein, when a ridge part side of the laser element is joined to the substrate, the optical element is joined to the substrate such that the position of the incidence part is shifted a predetermined distance downward with respect to the position of the light emission part.

3. The laser light source producing method according to claim 1, wherein, when one side of the laser element where the ridge part is not produced is joined to the substrate, the optical element is joined to the substrate such that the position of the incidence part is shifted a predetermined distance upward with respect to the position of the light emission part.

4. The laser light source producing method according to claim 1, wherein the incidence part of the optical element is placed in a position that is a distance to match an intermediate field of the laser light apart from the light emission part of the laser element.

5. The laser light source producing method according to claim 1, wherein the optical element is a wavelength conversion element to convert a wavelength of the laser light emitted from the laser element.

* * * * *